United States Patent [19]
Vajana et al.

[11] Patent Number: 5,793,085
[45] Date of Patent: Aug. 11, 1998

[54] BIPOLAR TRANSISTOR COMPATIBLE WITH CMOS PROCESSES

[75] Inventors: Bruno Vajana, Bergamo; Emilio Ghio, Milan, both of Italy

[73] Assignee: SGS-Thomson Microelectronics S.r.l., Agrate Brianza, Italy

[21] Appl. No.: 481,928

[22] Filed: Jun. 7, 1995

Related U.S. Application Data

[63] Continuation of Ser. No. 201,881, Feb. 24, 1994, abandoned.

[30] Foreign Application Priority Data

Feb. 26, 1993 [EP] European Pat. Off. ............ 93830081

[51] Int. Cl.⁶ .................................................. H01L 29/76
[52] U.S. Cl. .................... 257/370; 257/371; 257/336; 257/344; 257/408
[58] Field of Search ...................... 257/320, 371, 257/336, 344, 408

[56] References Cited

U.S. PATENT DOCUMENTS

| | | | |
|---|---|---|---|
| 4,120,707 | 10/1978 | Beasom | 257/370 |
| 4,403,395 | 9/1983 | Curran | 29/571 |
| 4,628,341 | 12/1986 | Thomas | 357/42 |
| 4,764,482 | 8/1988 | Hsu | 437/57 |
| 4,806,499 | 2/1989 | Shinohara | 437/31 |
| 5,045,912 | 9/1991 | Ohki | 257/370 |
| 5,066,602 | 11/1991 | Takemoto et al. | 437/31 |
| 5,179,036 | 1/1993 | Matsumoto | 257/370 |

FOREIGN PATENT DOCUMENTS

| | | | |
|---|---|---|---|
| 1158765 | 6/1989 | Japan | H01L 27/06 |

*Primary Examiner*—Edward Wojciechowicz
*Attorney, Agent, or Firm*—David V. Carlson; Seed and Berry LLP

[57] ABSTRACT

A bipolar transistor, comprising a collector region, a base region, and an emitter region, is a type which is compatible to CMOS processes leading to the formation, on a semiconductor substrate, of N-channel and P-channel MOS transistors having respective source and drain regions. In such bipolar transistor, the collector region is a substrate diffused pocket and the base region is formed within the diffused pocket simultaneously with the source and drain regions of the P-channel MOS transistors. Further, the emitter region is incorporated, in turn, to the base region simultaneously with the source and drain regions of the N-channel MOS transistors.

14 Claims, 3 Drawing Sheets

5,793,085

1

BIPOLAR TRANSISTOR COMPATIBLE WITH CMOS PROCESSES

CROSS REFERENCE TO RELATED APPLICATION

This application is a continuation of U.S. patent application Ser. No. 08/2011,881, filed Feb. 24, 1994, now abandoned.

Field of Application

This invention relates to the manufacturing of N-channel and P-channel MOS and bipolar transistors using CMOS processes.

PRIOR ART

As is well known, CMOS technology manufacturing processes which allow the implementation of electronic integrated circuits including MOS transistors, also result in parasitic bipolar transistors being obtained which may be utilized as active components in various analog and bandgap reference devices.

The utilization of this kind of parasitic bipolar transistors, in combination with MOS transistors, presently constitutes a useful alternative to the bipolar-CMOS combined technology processes and is gaining increasing acceptance.

A major advantage resides in that these devices can be formed without any additional masking to the basic CMOS processes.

The currently known CMOS processes, which provide for the aforementioned combination of MOS and bipolar transistors, are of two types:

N-Well MOS with either NPN lateral or PNP vertical bipolar transistors; and, P-Well MOS with either PNP lateral or NPN vertical bipolar transistors.

While being in many ways advantageous, these prior devices still have some limitations, due to the process used to implement them, such limitations restrict their performance and range of possible applications. For example, lateral transistors of the type indicated above, usually have a low current gain and are only employed in actual practice for some special applications, such as in protection circuits against electrostatic discharges. The bipolar transistors of the vertical type have, on the other hand, a disadvantage in that they can only operate in the common-collector configuration because the substrate is held at a fixed reference potential, at all times. Furthermore, PNP transistors implemented by N-Well CMOS processes—which are the more widely used ones—have an additional disadvantage in that their current gain is lower than that of NPN transistors which are implemented by P-Well CMOS processes. Lastly, the scaling of such CMOS devices involves increased Well pocket concentration, which is apt to further impair the performance of the bipolar transistors incorporated thereto.

Thus, on the whole, the aforementioned shortcomings greatly restrict the performance and range of applications for bipolar transistors implemented in CMOS technology.

SUMMARY OF THE INVENTION

According to principles of the present invention, a novel structure of a bipolar transistor implemented in CMOS technology is provided, which has such design and functional features as to overcome the above-noted shortcomings of prior art solutions in order to expand its field of application and to become usable with any polarization patterns.

2

The present invention provides a method of integrating, in a N-Well CMOS process, a vertical bipolar transistor of the NPN type using the standard CMOS structure itself To obtain such an NPN vertical bipolar transistor, the present invention uses: as the emitter, the source and N+ drain implant of an N-channel MOS transistor; as the base, the P– implant for making the gradual diffusion junctions (LDD) of a P-channel MOS transistor and, as the collector, the Well diffusion.

Overall, the present invention provides a bipolar transistor of the type indicated above and defined in claim 1. Further preferred forms of the transistor according to the invention are disclosed herein and claimed in claims 2 to 10.

The features and advantages of a bipolar transistor according to the invention will appear from the following description of an embodiment thereof, given by way of example and not of limitation with reference to the accompanying drawings.

DETAILED DESCRIPTION

Figure 1:
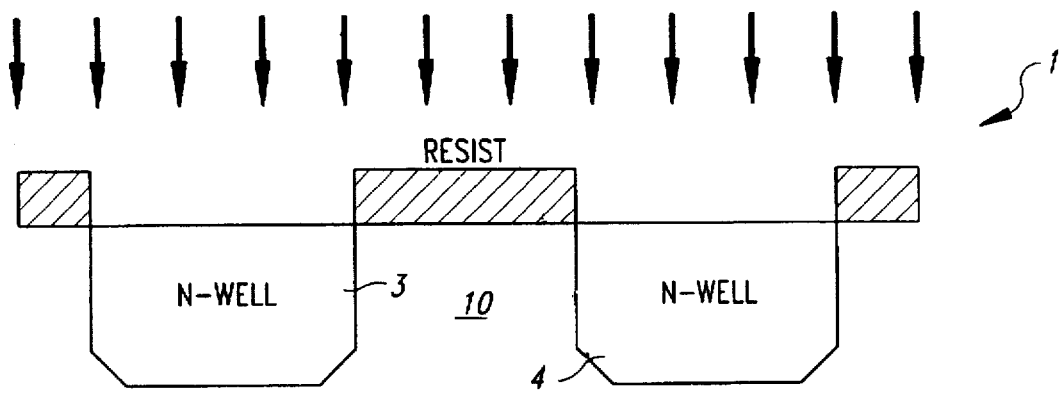
FIGS. 1 to 3 show, to an enlarged scale, respective schematical views in vertical section of a CMOS structure as implemented on a semiconductor substrate in the course of the CMOS technology production process under the present invention.

With reference to the drawings, schematically shown at 1 is a CMOS structure wherein, in accordance with this invention, a bipolar transistor 2 is formed to include base B1, collector C1 and emitter E1 regions. The bipolar transistor 2 of this invention is illustrated by comparison to a P-channel MOS transistor 7 depicted in the structure 1 in FIG. 3.

The drawing figures illustrate schematically a comparison between the construction of the NPN bipolar transistor 2 according to the invention and the P-channel transistor 7, for the purpose of bringing out more clearly the compatibility of the two constructions.

The N-channel MOS transistors, such as would in any case be fabricated under the CMOS manufacturing processes described herein, have been omitted from the drawings because they are conventional, as is known by those of ordinary skill in the art.

In describing the structure 1 of this invention, cross references to the manufacturing process for its implementation are added herein.

The inventive arrangement includes inserting the bipolar transistor 2 in the N-Well CMOS structure 1 such that the corresponding collector C1 can be freely biased and, accordingly, the device can be utilized with any polarization configuration. To this end, on a semiconductor substrate 10 there are defined two discrete diffused pockets 3, 4 of the so-called Well type. The pockets 3 and 4 are formed by a suitable step of masking the substrate 10 surface, followed by ion implantation with a dopant species of the N type, e.g. phosphorus. A thermal treatment, known to those skilled in the art, allows the dopant to be evenly diffused while controlling the extent of each N-Well pocket 3,4. FIG. 1 illustrates in schematical form the outcome of these process steps.

The pocket 3 constitutes the collector region C1 of the bipolar transistor 2.

An oxidation step followed by partial removal of a silicon oxide layer yields respective isolation regions 5 referred to as field oxide regions. Then, in those areas where the field oxide has been removed, a so-called gate oxide is grown, whereafter the gate areas are defined in polysilicon limited to the CMOS structures.

Figure 2:
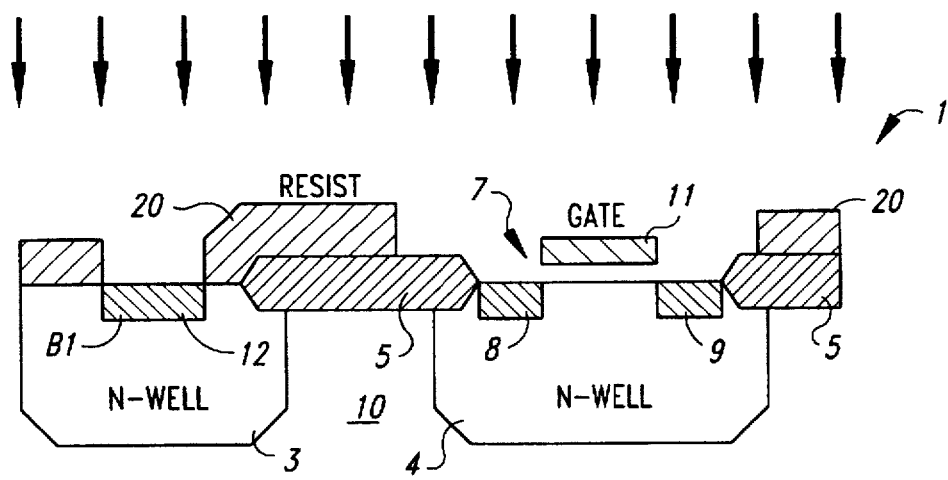

On the other hand, masking with a photoresist 20 and a subsequent wet etching step allow respective apertures to be formed through the photoresist over the pockets 3 and 4. Formed through such apertures are, on one side, the source 8 and drain 9 diffused regions of the P-channel MOS transistor 7 within pocket 4 and, on the other side, a region 12 within pocket 3. These regions 8, 9 and 12 are preferably formed by ion implantation with a dopant species of the P type, as shown in FIG. 2. Specifically, this process step is carried out by means of an LDD (Lightly Doped Drain) P– implantation which is also utilized to make the gradual junctions of the P-channel MOS transistor 7 of the CMOS structure.

Advantageously, according to the invention, the P-doped region 12 constitutes essentially the base region B1 of the bipolar transistor 2. Thus, by appropriate masking, the P– implant allows both the base region 12 of the bipolar transistor 2 and the low dopant concentration LDD source and drain regions 8 and 9 of the P-channel MOS transistor to be formed at one time. Therefore, compared to a conventional CMOS process providing for LDD P– implantation, no further process steps need be added, apart from an appropriate patterning of the P– mask to also produce the base regions of the bipolar transistors.

Figure 3:
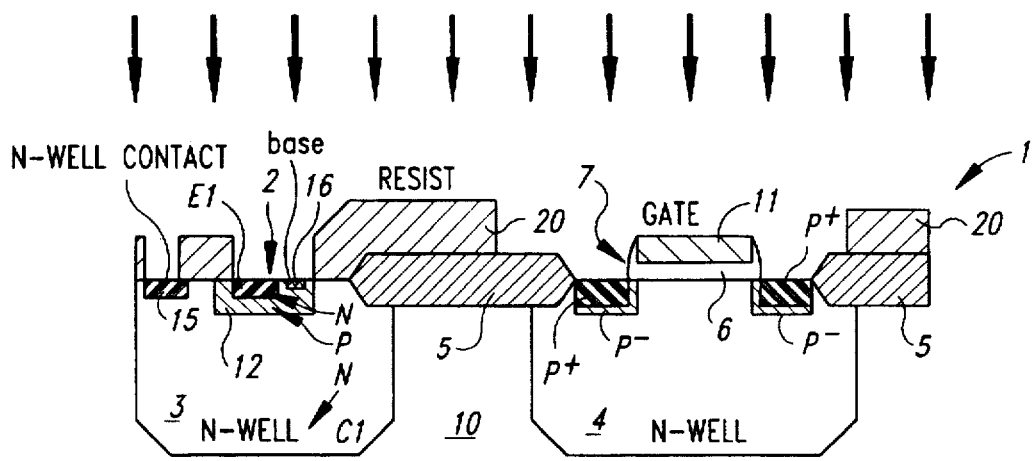

Thereafter, by suitable masking, an implantation at a high concentration of dopant of P+ type is performed in the source and drain regions of the P-channel MOS transistors, as shown in FIG. 3. The resulting implant will be set adequately apart from the gate regions by dielectric spacers 6. Advantageously, this P+ implant is also utilized to provide a good, low resistivity base contact 16 in the bipolar transistor 2.

The CMOS technology process further includes, of course, the deposition of a gate oxide layer to define the gate terminals 11 of the P-channel and N-channel transistors, as is known to those of ordinary skill in the art.

The emitter E1 of the bipolar transistor 2 is formed, on the other hand, by an N+ implant received in the base region 12 and also utilized to provide the source and drain areas of the N-channel MOS transistor, not shown in the drawings because they are conventional in formation and structure.

Additionally, the N+ implant is utilized to provide a contact region 15 within the N-Well pocket 3 laterally of the base region 12. This region 15 is to constitute the terminating contact of the collector C1.

Thus, the bipolar transistor 2 described in the foregoing has a vertical structure of the NPN type with: an emitter E1 provided by the source/drain N+ implant of the N-channel transistor, a base B1 provided by an LDD P– implant, a base contact 16 provided by a source/drain P+ implant of the P-channel transistors, and the collector C1 consisting of the N-Well pocket and the collector contact provided by the N+ implant of the N-channel source/drain regions.

Figure 4:
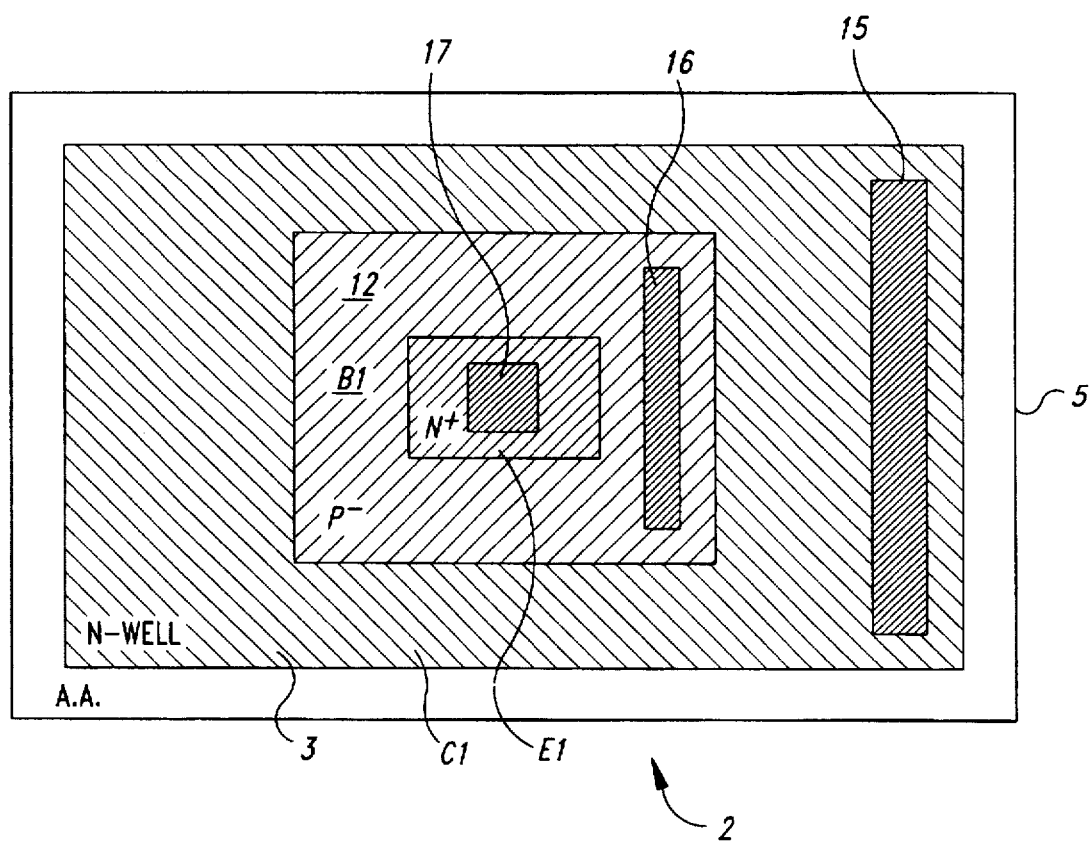
FIG. 4 is a top plan view showing schematically the layout of a CMOS structure-compatible bipolar transistor according to the invention.

The top side view of the layout of the vertical NPN bipolar transistor yielded by the process just described is shown in FIG. 4 by way of example. An emitter contact area 17 is also shown in FIG. 4.

Compared to the prior art, the present invention provides at least the following advantages: the possibility of using the bipolar transistor 2 in the most suitable of polarization patterns, since its collector is not bound to a fixed potential; and a higher current gain, leading to obvious advantages as relates to the bipolar transistor's performance.

The manufacturing process for the CMOS device of this invention proceeds from a traditional N-Well CMOS manufacturing process, but in order to insert the NPN bipolar transistor, the present invention discloses a method by which no additional steps are needed besides appropriate masking patterns for N-Wells, LDD P– implant, source/drain P+ implant for the P-channel transistors, and source/drain N+ implant for the N-channel transistors. The specific geometries of the masking patterns will vary between particular applications, as is known by those of ordinary skill in the relevant art.

It should be noted that the invention may be also applied to processes involving no LDD P– implantation; in this case, the mere addition of an appropriate mask for the base P– implant of the bipolar transistor 2 would be required.

Figure 5:
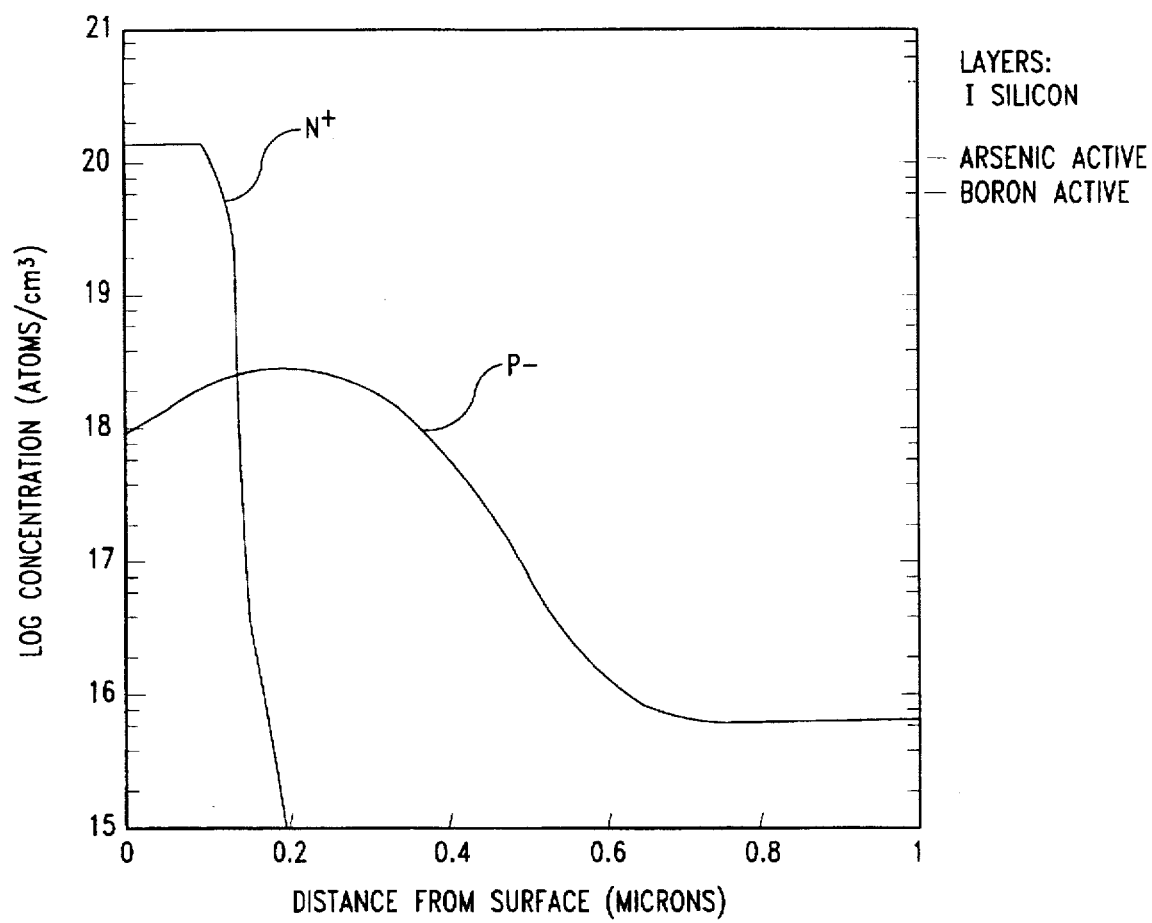
FIG. 5 is a graph of simulated implant profiles relating to the bipolar transistor contained in the CMOS structure according to the invention.

As an example only, to demonstrate that the insertion of a vertical NPN bipolar transistor in an N-Well CMOS structure as described above was indeed feasible, several simulations of the implantation profiles were run which showed that the depth of the implants made was adequate to guarantee an effective NPN structure. The graph of FIG. 5 shows, in fact, two curves with log concentrations of N+ and P– dopants plotted versus distance from the semiconductor surface. FIG. 5 shows that the doping depth is actually quite close to the typical one for an NPN bipolar transistor with classic structure.

The bipolar transistor 2 is applicable to all those integrated circuits in CMOS technology which include analog circuit portions with bipolar transistors.

Moreover, a lateral structure NPN bipolar transistor could also be implemented using the principle of this invention, if desired. Similarly, a vertical PNP bipolar transistor could be formed by following the teachings herein for the vertical NPN, using instead an isolated P-well structure for the collector, the N-implants for the N-channel source/drain devices for the base and the P-inplants for P-channel source/drain regions for the emitter. To that end, it would be sufficient to change the pattern of the implantation masks, but there would be no need to significantly alter the standard CMOS process steps.

Understandably, many changes and modifications may be made unto the bipolar transistor of this invention without departing from the scope of the invention as defined in the appended claims.

What is claimed is:

1. A BiCMOS integrated circuit structure formed using CMOS processes, the integrated circuit structure comprising:

a substrate having an upper surface;

spaced first and second wells of a first conductivity type in the upper surface of said substrate, said first well being a collector of a bipolar transistor;

first, second, and third regions of a second conductivity type having a first concentration, said first region being formed in an upper surface of said first well and said second and third regions being formed in an upper surface of said second well, said first region being a base of the bipolar transistor and said second and third regions being a source and drain of a MOS transistor of a first type, respectively, said first, second, and third regions being of the same dopant concentration and being formed simultaneously with each other;

a gate electrode of the MOS transistor overlying said second well and in a position between said second and third regions;

fourth and fifth regions of the second conductivity type having a second concentration, the second concentration being higher than the first concentration, said fourth and fifth regions being formed in an upper surface of said second and third regions, respectively, said fourth and fifth regions being spaced apart from the region overlayed by said gate electrode; and a sixth region of the first conductivity type in an upper surface of said first region, said sixth region being an emitter of the bipolar transistor.

2. The circuit structure of claim 1, further comprising:

a first contact region in an upper surface of said first well spaced from said first region, said first contact region being a terminating contact for the collector of the bipolar transistor, such that the collector of the bipolar transistor may be freely biased.

3. The circuit structure of claim 1, further comprising:

oxide spacers exterior to said gate electrode and overlying said fourth and fifth regions.

4. The circuit structure of claim 1 wherein the first conductivity is N-type and the second conductivity is P-type.

5. The circuit structure of claim 1 wherein the first conductivity type is P-type and the second conductivity is N-type.

6. The circuit structure of claim 1, further comprising:

a second contact region in an upper surface of said first well spaced from said sixth region, said second contact region being a terminating contact for the base of the bipolar transistor.

7. The circuit structure of claim 1 wherein the bipolar transistor is a vertical bipolar transistor.

8. A semiconductor structure that includes a first MOS transistor of a first type and a vertical bipolar transistor formed using a CMOS process, the structure comprising:

a drain region of said MOS transistor disposed in a first diffused pocket of a substrate, said diffused pocket having a first conductivity, said drain region having a second conductivity;

a source region of said MOS transistor disposed in said first diffused pocket, said source region having said second conductivity;

lightly doped drain and source regions disposed in a portion of said first diffused pocket, said portion located between said source and drain regions, said lightly doped drain and source regions being respectively contiguous with said drain and source regions and having said second conductivity;

a collector region formed in a second diffused pocket of said substrate, said collector region having said first conductivity;

a base region formed in an upper surface of said collector region, said base region having said second conductivity, said base region being of a same dopant concentration and being formed simultaneously with said lightly doped source and drain regions; and an emitter region formed in an upper surface of said base region, said emitter region having said first conductivity.

9. The semiconductor structure of claim 8 wherein said emitter region is formed simultaneously with source and drain regions of a second MOS transistor of a second type.

10. The semiconductor structure of claim 8 wherein the first conductivity is N-type and the second conductivity is P-type.

11. The semiconductor structure of claim 8 wherein the first conductivity is P-type and the second conductivity is N-type.

12. The semiconductor structure of claim 8 further comprising:

a collector contact region formed in said upper surface of said collector region.

13. The semiconductor structure of claim 8 further comprising:

a base contact region formed in said upper surface of said base region, said base contact region being spaced from said emitter region and being formed simultaneously with said source and drain regions.

14. A BiCMOS integrated circuit structure formed using CMOS processes, the integrated circuit structure comprising:

a substrate having an upper surface;

spaced first and second wells of a first conductivity type in the upper surface of said substrate, said first well being a collector of a bipolar transistor;

first, second, and third regions of a second conductivity type having a first concentration, said first region being formed in an upper surface of said first well and said second and third regions being formed in an upper surface of said second well, said first region being a base of the bipolar transistor and said second and third regions being a source and drain of a MOS transistor of a first type, respectively, said first, second, and third regions being of the same dopant concentration and being formed simultaneously with each other;

a first contact region in an upper surface of said first well spaced from said first region, said first contact region being a terminating contact for the collector of the bipolar transistor, such that the collector of the bipolar transistor may be freely biased;

a gate electrode of the MOS transistor overlying said second well and in a position between said second and third regions;

fourth and fifth regions of a second conductivity type having a second concentration, the second concentration being higher than the first concentration, said fourth and fifth regions being formed in an upper surface of said second and third regions, respectively, said fourth and fifth regions being spaced apart from the region overlayed by said gate electrode; and a sixth region of a first conductivity type in an upper surface of said first region, said sixth region being an emitter of the bipolar transistor.

* * * * *